United States Patent
Yang et al.

(10) Patent No.: US 7,907,770 B2
(45) Date of Patent: Mar. 15, 2011

(54) METHOD FOR INSPECTING PHOTOMASK AND REAL-TIME ONLINE METHOD FOR INSPECTING PHOTOMASK

(75) Inventors: Chung-Yen Yang, Tainan County (TW); Ming-Che Chang, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 942 days.

(21) Appl. No.: 11/763,933

(22) Filed: Jun. 15, 2007

(65) Prior Publication Data
US 2008/0310703 A1 Dec. 18, 2008

(51) Int. Cl.
*G06K 9/00* (2006.01)
(52) U.S. Cl. .......................... 382/144; 382/100; 382/141
(58) Field of Classification Search .................. 382/100, 382/141, 144
See application file for complete search history.

(56) References Cited

U.S. PATENT DOCUMENTS

| | | | |
|---|---|---|---|
| 6,803,554 B2 * | 10/2004 | Ye et al. ..................... | 250/208.1 |
| 6,988,045 B2 | 1/2006 | Purdy | |
| 7,123,356 B1 | 10/2006 | Stokowski et al. | |
| 7,508,973 B2 * | 3/2009 | Okabe et al. .................. | 382/145 |
| 2006/0244958 A1 * | 11/2006 | Furman et al. ............. | 356/237.4 |
| 2008/0130982 A1 * | 6/2008 | Kitamura et al. ............. | 382/144 |
| 2010/0080443 A1 * | 4/2010 | Preil et al. ..................... | 382/144 |

FOREIGN PATENT DOCUMENTS

TW I222696 10/2004

* cited by examiner

*Primary Examiner* — Bhavesh M Mehta
*Assistant Examiner* — Stephen R Koziol
(74) *Attorney, Agent, or Firm* — WPAT, PC; Justin King

(57) ABSTRACT

A method for inspecting a photomask is provided, which is applicable for the photomask with a pattern region and a blank region. First, a wafer is performed a photolithography process by the photomask. The wafer includes a plurality of exposure regions, each of which has a component pattern region. Each component pattern region is surrounded by a scribe line region. Each component pattern region corresponds to the pattern region of the photomask, while the scribe line region corresponds to the blank region of the photomask. Afterwards, the scribe line region is divided into a plurality of virtual pattern regions. The virtual pattern regions are processed by an overlap comparison step one by one. As at least one of the virtual pattern regions overlaps the others incompletely, a part of the blank region on the photomask corresponding to the incompletely-overlapping virtual pattern region has a haze.

16 Claims, 2 Drawing Sheets

METHOD FOR INSPECTING PHOTOMASK AND REAL-TIME ONLINE METHOD FOR INSPECTING PHOTOMASK

BACKGROUND OF THE INVENTION

1. Field of the Invention

The present invention relates to a method for inspecting a photomask. More particularly, the present invention relates to a real-time online method for inspecting a photomask.

2. Description of Related Art

Recently, semiconductors have been developed towards the design trend of miniaturizing the circuit components, and one of the most important steps in the whole semiconductor process is photolithography process. As for critical dimension (CD) relevant to the structure of the semiconductor device, the pattern of each thin film, for example, is determined by the photolithography process. Therefore, the accuracy of pattern transfer from the photomask to the wafer plays a crucial role. If the pattern on the photomask is not accurate, the pattern transfer is made to be further away from being accurate, which thus affects the tolerance of the CD on the wafer, and reduces the resolution of the exposure.

In a general fabrication of the photomask, sulfuric acid is usually used to clean the photomask, such that residual sulfate ions ($SO_4^{2-}$) remain on the photomask. Then, during the photolithography process, an exposure is performed by the photomask to transfer the pattern on the photomask to the wafer, and the sulfate ions ($SO_4^{2-}$) on the photomask and ammonium ions ($NH_4^+$) are easily bonded with each other, or other particles may be adhered on the photomask, so as to result in a haze on the photomask. The haze formed at the beginning is quite small in size, which has barely effect on the process. However, as the process time prolongs or as the times for performing the photolithography process increases, the chemical change continuously occurs on the photomask, which causes the haze to be gradually enlarged to further affect the pattern on the photomask. If the photomask with the enlarged haze is used to perform the pattern transfer, the pattern transferred to the wafer is usually inaccurate, which seriously affects the subsequent process.

Generally, in order to determine whether the photomask has a haze or not, a photomask inspecting tool is used to scan the photomask. However, before using the photomask inspecting tool to inspect the photomask, it is necessary to take out the photomask from the equipment to perform an off-line photomask inspection. In this manner, it has to consume time in waiting for the result of the inspection, and the sampling rate of the inspection is relatively low. Furthermore, the photomask inspecting tool is usually very expensive, such that the cost is greatly increased.

SUMMARY OF THE INVENTION

Accordingly, the present invention is directed to a method for inspecting a photomask, which defines virtual pattern regions in a scribe line region on a wafer, and performs an overlap comparison on the virtual pattern regions to determine whether the used photomask has a haze or not.

The present invention is further directed to a real-time online method for inspecting a photomask, which is capable of sampling processed wafers for defect while performing the photolithography process.

As embodied and broadly described herein, the present invention provides a method for inspecting a photomask, which is applicable for a photomask having a pattern region and a blank region. Firstly, a wafer is provided for performing a photolithography process by the photomask. The wafer has a plurality of exposure regions. Each exposure region has a component pattern region, and each component pattern region is surrounded by a scribe line region. Each component pattern region corresponds to the pattern region of the photomask, and the scribe line region corresponds to the blank region of the photomask. Then, the scribe line region is divided into a plurality of virtual pattern regions. Next, an overlap comparison step is performed one by one on the virtual pattern regions. When at least one of the virtual pattern regions incompletely overlaps the other virtual pattern regions, a part of the blank region on the photomask corresponding to the incompletely-overlapping virtual pattern region has a haze.

In an embodiment of the present invention, the haze includes an ammonium sulfate particle.

In an embodiment of the present invention, the haze includes residual particles after the photomask is cleaned.

In an embodiment of the present invention, the haze includes a chemical product.

In an embodiment of the present invention, the overlap comparison step further includes performing an overlap comparison one by one on two neighboring virtual pattern regions.

In an embodiment of the present invention, when the incompletely-overlapping virtual pattern region is screened, the overlap comparison step further includes performing a repeater analysis.

In an embodiment of the present invention, the repeater analysis includes performing an overlap comparison on the corresponding virtual pattern regions of the respective scribe line regions in two exposure regions.

In an embodiment of the present invention, when an incompletely-overlapping first virtual pattern of a first exposure region completely overlaps a second virtual pattern corresponding to the incompletely-overlapping first virtual pattern in a second exposure region, a part of the blank region on the photomask corresponding to the first virtual pattern is defined to have a haze.

The present invention further provides a real-time online method for inspecting a photomask, which is applicable for performing a photolithography process on a plurality of wafers by using a photomask having a pattern region and a blank region. Firstly, a sampling inspection mechanism is set, and the sampling inspection mechanism includes a sampling circulation time and a number of wafers already accomplished by the photolithography process. Then, a sampling inspection step is performed, if a continuous process time and times for performing the photolithography process on the wafers by using the photomask satisfy one of the sampling circulation time or the number of wafers already accomplished by the photolithography process. The sampling inspection step includes firstly sampling a first wafer from the wafers already accomplished by the photolithography process. The first wafer has a plurality of exposure regions. Each exposure region has a component pattern region, and each component pattern region is surrounded by a scribe line region. Each component pattern region corresponds to the pattern region of the photomask, and the scribe line region corresponds to the blank region of the photomask. Next, the scribe line region is divided into a plurality of virtual pattern regions. Then, an overlap comparison step is performed one by one on the virtual pattern regions, in which if at least one of the virtual pattern regions incompletely overlaps the other virtual pattern regions, a part of the blank region on the photomask corresponding to the incompletely-overlapping virtual pattern region has a haze. In addition, the photolithography process is continuously performed, if the continuous process time does not satisfy the sampling circulation time and the times for performing the process does not satisfy the number of wafers already accomplished by the photolithography process.

In an embodiment of the present invention, the haze includes an ammonium sulfate particle.

In an embodiment of the present invention, the haze includes residual particles after the photomask is cleaned.

In an embodiment of the present invention, the haze includes a chemical product.

In an embodiment of the present invention, the overlap comparison step further includes performing an overlap comparison one by one on two neighboring virtual pattern regions.

In an embodiment of the present invention, when the incompletely-overlapping virtual pattern region is screened, the overlap comparison step further includes performing a repeater analysis.

In an embodiment of the present invention, the repeater analysis includes performing an overlap comparison on the corresponding virtual pattern regions of the respective scribe line regions in two exposure regions.

In an embodiment of the present invention, when an incompletely-overlapping first virtual pattern of a first exposure region completely overlaps a second virtual pattern corresponding to the incompletely-overlapping first virtual pattern in a second exposure region, a part of the blank region on the photomask corresponding to the first virtual pattern is defined to have the haze.

In the present invention, the virtual pattern regions are defined on the wafers already accomplished by the photolithography process, and the overlap comparison is performed one by one on the virtual pattern regions to determine whether the photomask used by the process has the haze or not. Therefore, in the present invention, during the photolithography process, the sampling inspection process is performed on the wafer to achieve the real-time online inspection of the photomask, so as to avoid affecting the subsequent process.

In order to make the aforementioned and other features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

During the photolithography process, the exposure process generates a haze on the photomask. What's worse, the haze gradually expands as the process time elapses, which not only affects the subsequent process, but also affects the process reliability, and thus wasting many process cost. Therefore, in the present invention, during the photolithography process, the effect of the haze on the pattern transfer is also considered, such that the wafers already accomplished by the process are compared, so as to effectively inspect whether the haze is formed on the photomask or not. The implementation manner of the real-time online method for inspecting the photomask of the present invention is further described below through the flow chart.

Figure 1A:
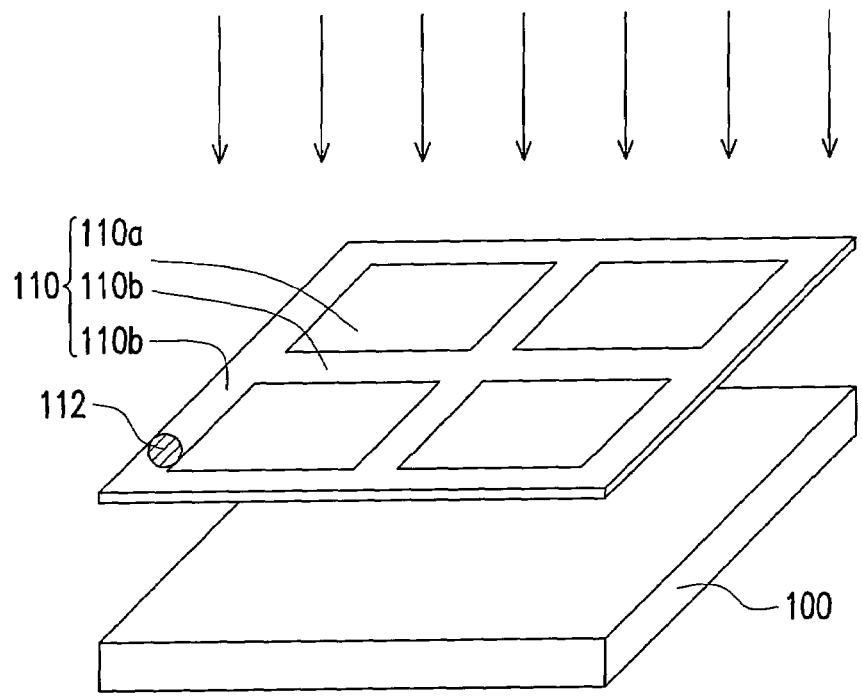
FIG. 1A is a schematic view of a photolithography process according to an embodiment of the present invention.
Figure 1B:
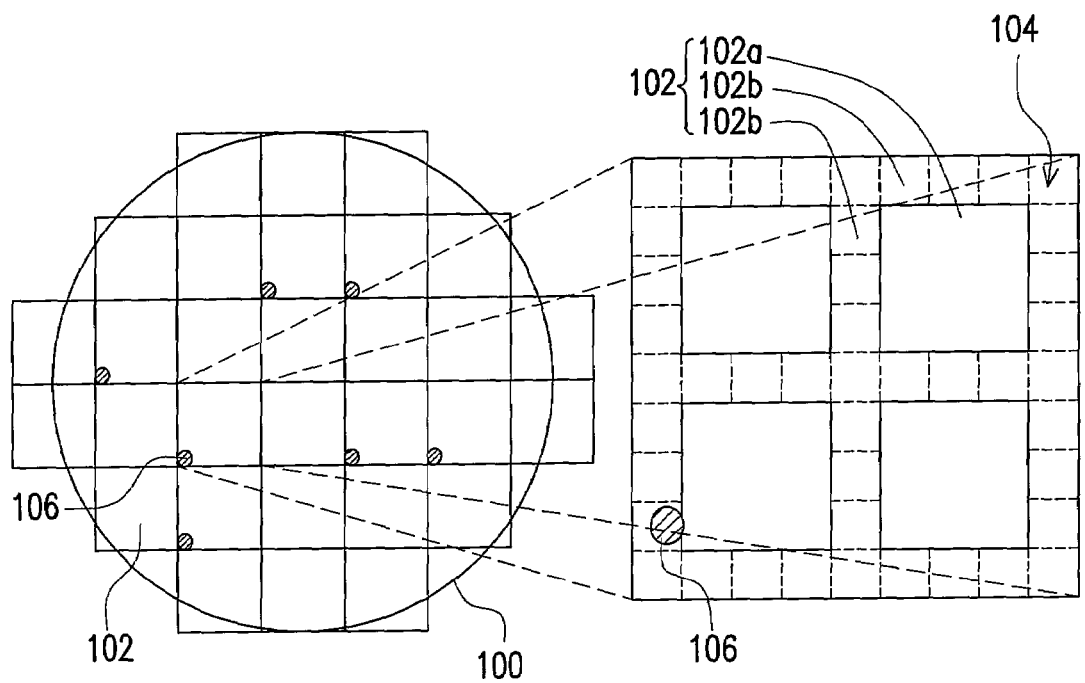
FIG. 1B is a schematic top view of a wafer according to an embodiment of the present invention.
Figure 2:
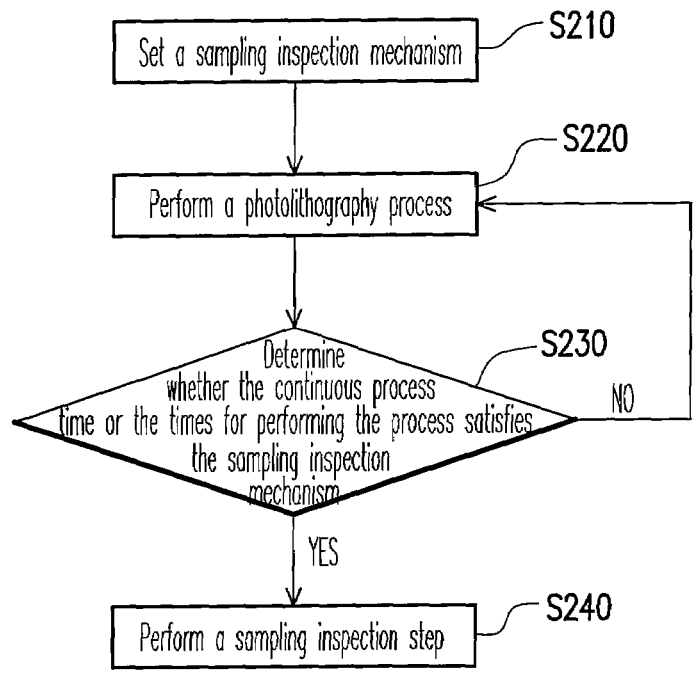
FIG. 2 is a flow chart of a real-time online method for inspecting a photomask according to an embodiment of the present invention.
Figure 3:
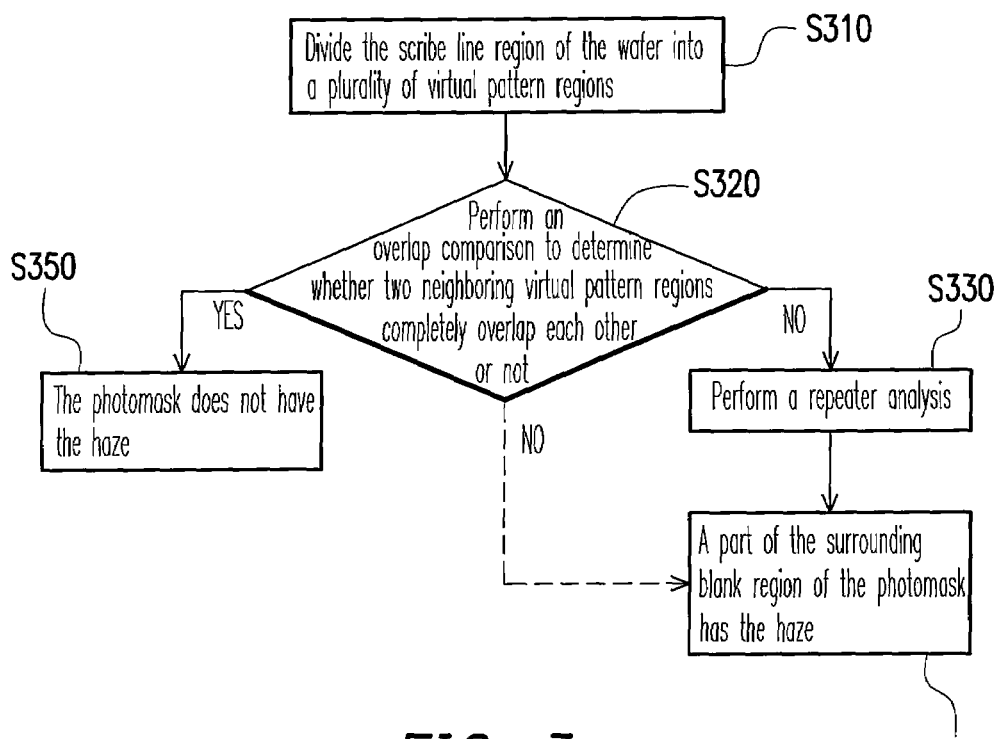
FIG. 3 is a flow chart of a sampling inspection step according to an embodiment of the present invention.

FIG. 1A is a schematic view of a photolithography process according to an embodiment of the present invention. FIG. 1B is a schematic top view of a wafer according to an embodiment of the present invention. FIG. 2 is a flow chart of a real-time online method for inspecting a photomask according to an embodiment of the present invention. FIG. 3 is a flow chart of a sampling inspection step according to an embodiment of the present invention.

Firstly, referring to FIG. 2, in Step S210, a sampling inspection mechanism is set. The sampling inspection mechanism, for example, sets a sampling circulation time or a number of wafers already accomplished by the photolithography process. In an embodiment, the time consumed for finishing each batch of wafers by the equipment for the photolithography process is 40 min, and the number of wafers in each finished batch is 25. The sampling inspection mechanism is, for example, defined as performing a sampling inspection once after each 8 batches of wafers are finished, that is, the sampling circulation time is set to be 320 min, and the number of wafers already accomplished by the photolithography process is set to be 200. Definitely, the sampling inspection mechanism is not limited to the setting of the above embodiment, and those of ordinary skill in the art can make adjustment or modifications depending upon properties of the equipment or requirements of the process.

Next, in Step S220, the photolithography process is performed. Referring to both FIGS. 1A and 1B, during the photolithography process, a stepper, for example, is used to perform an exposure repeatedly for a plurality of times on different positions on a plurality of wafers 100 by using the photomask 110. The photomask 110 has a pattern region 110a and a blank region 110b. A thin film layer (not shown) and a photoresist material layer (not shown), for example, are deposited on the wafer 100. As shown in FIG. 1B, the wafer 100 already accomplished by the photolithography process has a plurality of exposure regions 102 thereon, in which each exposure region 102 has a component pattern region 102a, and the component pattern region 102a is surrounded by a scribe line region 102b. Each exposure region 102 on the wafer 100, for example, corresponds to the photomask 110, the component pattern region 102a corresponds to the pattern region 110a of the photomask 110, and the scribe line region 102b corresponds to the blank region 110b of the photomask 110.

It should be particularly noted that, the haze 112 is generally formed on the blank region 110b of the photomask 110, and as the proceeding of the process, the haze 112 gradually expands to the pattern region 110a. When the photomask 110 with the haze 112 is used to perform the photolithography process, a defect pattern 106 is generated on the processed wafer 100. The position of the defect pattern 106 corresponds to that of the haze 112, which gradually affects the component pattern region 102a of the processed wafer 100 as the expanding of the haze 112. That is to say, even if a very small haze 112 is just formed on the blank region 110b, the defect pattern 106 is further found to be generated on the corresponding scribe line region 102b. The haze 112 can be ammonium sulfate particles, residual particles after the photomask 110 is cleaned, or other chemical products. Definitely, the layout of the photomask 110 and the wafer 100 is not limited to that shown in FIGS. 1A and 1B, those of ordinary skill in the art can make adjustment according to the actual requirements.

Accordingly, in Step S230, it is determined whether the continuous process time or the times for performing the photolithography process on the wafer 100 by using the photomask 110 satisfies one of the sampling circulation time and the number of wafers already accomplished by the photolithography process set by the sampling inspection mechanism. If the continuous process time and the times for performing the process satisfy one of the sampling circulation time and the number of wafers accomplished by the photolithography process, the sampling inspection step is performed to determine whether the photomask has the haze or not (Step S240). If the continuous process time of performing the photolithography process does not satisfy the sampling circulation time, and the times for performing the process does not satisfy the preset number of wafers accomplished by the photolithography process, the photolithography process is continuously performed till the set sampling inspection mechanism is satisfied.

Referring to FIGS. 1A, 1B, and 3, the sampling inspection step includes, for example, sampling one wafer 100 from the wafers 100 accomplished by the photolithography process. Generally, the haze 112 begins to be generated at the blank region 110b of the photomask 110. That is, after the photolithography process is finished, the defect pattern 106 is easily generated on the scribe line region 102b of the wafer 100. Therefore, in Step S310, the scribe line region 102b is divided into a plurality of virtual pattern regions 104, which are used for inspecting the detect pattern 106.

In Step S320, the overlap comparison step is performed one by one on the virtual pattern region 104. The overlap comparison step includes, for example, performing an overlap comparison to determine whether two neighboring virtual pattern regions 104 completely overlap each other or not. If all the virtual pattern regions 104 in the scribe line region 102b completely overlap each other in pairs, it is indicated that no defect patterns 106 are generated on the wafer 100, and the photomask 110 also does not have the haze 112 (Step S350).

On the other aspect, if at least one of the virtual pattern regions 104 has the defect pattern 106, through the overlap comparison step performed one by one, this virtual pattern region can be found to incompletely overlap the other virtual pattern regions 104 without the defect pattern 106. In this manner, the virtual pattern region 104 is found to have the defect pattern 106 by means of inspecting the mutual overlapping relation between the respective virtual pattern regions 104 in the exposure region 102. Thus, corresponding to the photomask 110 used in the process, it is determined that a part of the blank region 110b of the photomask 110 has the haze 112 (Step S340). In addition, the relative positions between the defect pattern 106 and the whole exposure region 102 are inspected, so as to know a specific part where the blank region 110b the haze 112 is formed thereon.

Accordingly, when the overlap comparison is performed one by one to determine whether two neighboring virtual pattern region 104 incompletely overlap each other or not, and the incompletely-overlapping virtual pattern region 104 is screened, the repeater analysis is selectively performed (Step S330). The repeater analysis includes, for example, performing the overlap comparison on the corresponding virtual pattern regions 104 of the respective scribe line regions 102b in two different exposure regions 102. Since each exposure region 102 corresponds to the photomask 110, once the photomask 110 has the haze 112, the defect pattern 106 repeatedly occurs on the same corresponding position in different exposure regions 102. If two exposure regions 102, after the overlap comparison, have the incompletely-overlapping virtual pattern region 104 on the same position, the blank region 110b on the photomask 110 corresponding to the virtual pattern region 104 is defined to have the haze 112 (Step S340).

In other words, in Step S320, the virtual pattern regions 104 in the same exposure region 102 are compared, so as to select the incompletely-overlapping virtual pattern regions 104 with the defect pattern 106. In Step S330, the incompletely-overlapping virtual pattern regions 104 on different exposure regions 102 on the wafer 100 are compared, so as to inspect whether both the two exposure regions 102 have the defect pattern 106 on the corresponding position, and thus accurately defining the position of the haze 112 on the photomask 110.

It is known from the above that, during the photolithography process, a plurality of virtual pattern regions are defined in the scribe line region of the processed wafer, and the overlap comparison inspection is performed one by one on each virtual pattern region by means of the set sampling inspection mechanism, so as to further verify the corresponding photomask pattern or layout. In this manner, the real-time online inspection of the wafer exposure region is achieved, so as to predict whether a haze is generated on the photomask, without taking out the photomask to inspect. In addition, if it is inspected that the scribe line regions of different exposure regions on the wafer have a repeated defect pattern, the equipment can be further set to a real-time auto-hold action to perform an inspection, cleaning, or pattern corrections of the photomask. Furthermore, before the subsequent etching process is performed on the wafer, the wafer with the defect pattern can be reworked, those of ordinary skill in that art can easily appreciate the implementing manner, which thus will not be described herein any more.

To sum up, the present invention at least has the following advantages.

1. The method of the present invention can perform the online real-time photomask inspection, without having the photomask taken out from the equipment.

2. The method of the present invention can inspect the scribe line region of the wafer exposure region to determine whether the corresponding photomask has the haze or not, so it is quite convenient and time-saving, and the inspection cost is reduced.

3. The method of the present invention has an intelligent sampling inspection mechanism, which is capable of reducing the time in waiting for the inspecting result.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for inspecting a photomask, applicable for a photomask having a pattern region and a blank region, the method comprising:

providing a wafer for performing a photolithography process by the photomask, wherein the wafer has a plurality of exposure regions, each exposure region has a component pattern region, each component pattern region is surrounded by a scribe line region, each component pattern region corresponds to the pattern region of the photomask, and the scribe line region corresponds to the blank region of the photomask;

dividing the scribe line region into a plurality of virtual pattern regions; and performing an overlap comparison step on the virtual pattern regions one by one, wherein when at least one of the virtual pattern regions incompletely overlaps the other virtual pattern regions, a part of the blank region on the photomask corresponding to the incompletely-overlapping virtual pattern region is defined as a haze.

2. The method for inspecting the photomask according to claim 1, wherein the haze comprises an ammonium sulfate particle.

3. The method for inspecting the photomask according to claim 1, wherein the haze comprises residual particles after cleaning the photomask.

4. The method for inspecting the photomask according to claim 1, wherein the haze comprises a chemical product.

5. The method for inspecting the photomask according to claim 1, wherein the overlap comparison step further comprises performing an overlap comparison one by one on two neighboring virtual pattern regions.

6. The method for inspecting the photomask according to claim 1, wherein when the incompletely-overlapping virtual pattern region is screened, the overlap comparison step further comprises performing a repeater analysis.

7. The method for inspecting the photomask according to claim 6, wherein the repeater analysis comprises performing an overlap comparison on the corresponding virtual pattern regions of the respective scribe line regions in two exposure regions.

8. The method for inspecting the photomask according to claim 6, wherein if an incompletely-overlapping first virtual pattern of a first exposure region completely overlaps a second virtual pattern corresponding to the incompletely-overlapping first virtual pattern in a second exposure region, a part of the blank region on the photomask corresponding to the first virtual pattern is defined to have the haze.

9. A real-time online method for inspecting a photomask, applicable for performing a photolithography process on a plurality of wafers by using a photomask having a pattern region and a blank region, the method comprising:

setting a sampling inspection mechanism comprising a sampling circulation time and a number of wafers accomplished by a photolithography process;

performing a sampling inspection step, if a continuous process time and times for performing the photolithography process on the wafers by using the photomask satisfy one of the sampling circulation time or the number of wafers already accomplished by the photolithography process, the sampling inspection step further comprising:

sampling a first wafer from the wafers already accomplished by the photolithography process, wherein the first wafer has a plurality of exposure regions; each exposure region has a component pattern region; each component pattern region is surrounded by a scribe line region; each component pattern region corresponds to the pattern region of the photomask, and the scribe line region corresponds to the blank region of the photomask;

dividing the scribe line region into a plurality of virtual pattern regions;

performing an overlap comparison step on the virtual pattern regions one by one, wherein when at least one of the virtual pattern regions incompletely overlaps the other virtual pattern regions, a part of the blank region on the photomask corresponding to the incompletely-overlapping virtual pattern region is defined as a haze; and continuously performing the photolithography process, if the continuous process time does not satisfy the sampling circulation time and the times for performing the process does not satisfy the number of wafers already accomplished by the photolithography process.

10. The real-time online method for inspecting the photomask according to claim 9, wherein the haze comprises an ammonium sulfate particle.

11. The real-time online method for inspecting the photomask according to claim 9, wherein the haze comprises residual particles after cleaning the photomask.

12. The real-time online method for inspecting the photomask according to claim 9, wherein the haze comprises a chemical product.

13. The real-time online method for inspecting the photomask according to claim 9, wherein the overlap comparison step further comprises performing an overlap comparison one by one on two neighboring virtual pattern regions.

14. The real-time online method for inspecting the photomask according to claim 9, wherein when the incompletely-overlapping virtual pattern region is screened, the overlap comparison step further comprises performing a repeater analysis.

15. The real-time online method for inspecting the photomask according to claim 14, wherein the repeater analysis comprises performing an overlap comparison on the corresponding virtual pattern regions of the respective scribe line regions in two exposure regions.

16. The real-time online method for inspecting the photomask according to claim 14, wherein when an incompletely-overlapping first virtual pattern of a first exposure region completely overlaps a second virtual pattern corresponding to the incompletely-overlapping first virtual pattern in a second exposure region, a part of the blank region on the photomask corresponding to the first virtual pattern is defined to have the haze.

* * * * *